US008486755B2

(12) United States Patent
Ararao et al.

(10) Patent No.: US 8,486,755 B2
(45) Date of Patent: Jul. 16, 2013

(54) MAGNETIC FIELD SENSORS AND METHODS FOR FABRICATING THE MAGNETIC FIELD SENSORS

(75) Inventors: Virgil Ararao, Rutland, MA (US); Nirmal Sharma, Shrewsbury, MA (US); Raymond W. Engel, Southbridge, MA (US); Jay Gagnon, Holden, MA (US); John Sauber, Millbury, MA (US); William P. Taylor, Amherst, NH (US); Elsa Kam-Lum, Amherst, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 12/328,798

(22) Filed: Dec. 5, 2008

(65) Prior Publication Data

US 2010/0141249 A1    Jun. 10, 2010

(51) Int. Cl.
*H01L 21/00* (2006.01)

(52) U.S. Cl.
USPC ............... 438/106; 438/3; 438/126; 257/378; 257/702

(58) Field of Classification Search
USPC ................. 438/106, 3, 126; 257/678, 702
See application file for complete search history.

(56) References Cited

U.S. PATENT DOCUMENTS

| 3,195,043 A | 7/1965 | Burig et al. |
| 3,281,628 A | 10/1966 | Bauer et al. |
| 3,661,061 A | 5/1972 | Tokarz |
| 4,048,670 A | 9/1977 | Eysermans |
| 4,188,605 A | 2/1980 | Stout |
| 4,204,317 A | 5/1980 | Winn |
| 4,283,643 A | 8/1981 | Levin |
| 4,315,523 A | 2/1982 | Mahawili et al. |
| 4,614,111 A | 9/1986 | Wolff |
| 4,733,455 A | 3/1988 | Nakamura et al. |
| 4,746,859 A | 5/1988 | Malik |
| 4,769,344 A | 9/1988 | Sakai et al. |
| 4,772,929 A | 9/1988 | Manchester |
| 4,908,685 A | 3/1990 | Shibasaki et al. |
| 4,935,698 A | 6/1990 | Kawaji et al. |
| 5,021,493 A | 6/1991 | Sandstrom |
| 5,028,868 A | 7/1991 | Murata et al. |
| 5,045,920 A | 9/1991 | Vig et al. |
| 5,084,289 A | 1/1992 | Shin et al. |

(Continued)

FOREIGN PATENT DOCUMENTS

| CH | 683 469 A5 | 3/1994 |
| DE | 102 31 194 A1 | 2/2004 |

(Continued)

OTHER PUBLICATIONS

"Gear-Tooth Sensor for Automotive Applications," Allegro Microsystems, Inc., Aug. 3, 2001.

(Continued)

*Primary Examiner* — Zandra Smith
*Assistant Examiner* — Jamie C Niesz
(74) *Attorney, Agent, or Firm* — Daly, Crowley, Mofford & Durkee, LLP

(57) ABSTRACT

Magnetic field sensors and associated methods of manufacturing the magnetic field sensors include molded structures to encapsulate a magnetic field sensing element and an associated die attach pad of a lead frame and to also encapsulate or form a magnet or a flux concentrator.

10 Claims, 7 Drawing Sheets

U.S. PATENT DOCUMENTS

| | | | |
|---|---|---|---|
| 5,121,289 A | 6/1992 | Gagliardi | |
| 5,137,677 A | 8/1992 | Murata | |
| 5,196,794 A | 3/1993 | Murata | |
| 5,210,493 A | 5/1993 | Schroeder et al. | |
| 5,216,405 A | 6/1993 | Schroeder et al. | |
| 5,247,202 A | 9/1993 | Popovic et al. | |
| 5,250,925 A * | 10/1993 | Shinkle | 338/32 R |
| 5,315,245 A | 5/1994 | Schroeder et al. | |
| 5,414,355 A | 5/1995 | Davidson et al. | |
| 5,434,105 A | 7/1995 | Liou | |
| 5,453,727 A | 9/1995 | Shibasaki et al. | |
| 5,488,294 A | 1/1996 | Liddell et al. | |
| 5,491,633 A | 2/1996 | Henry et al. | |
| 5,500,589 A | 3/1996 | Sumcad | |
| 5,508,611 A | 4/1996 | Schroeder et al. | |
| 5,581,170 A | 12/1996 | Mammano et al. | |
| 5,581,179 A | 12/1996 | Engel et al. | |
| 5,627,315 A | 5/1997 | Figi et al. | |
| 5,631,557 A | 5/1997 | Davidson | |
| 5,712,562 A | 1/1998 | Berg | |
| 5,719,496 A | 2/1998 | Wolf | |
| 5,781,005 A | 7/1998 | Vig et al. | |
| 5,818,222 A | 10/1998 | Ramsden | |
| 5,883,567 A * | 3/1999 | Mullins, Jr. | 338/32 H |
| 5,912,556 A | 6/1999 | Frazee et al. | |
| 5,963,028 A | 10/1999 | Engel et al. | |
| 6,016,055 A | 1/2000 | Jager et al. | |
| 6,175,233 B1 | 1/2001 | McCurley et al. | |
| 6,184,679 B1 | 2/2001 | Popovic et al. | |
| 6,265,865 B1 | 7/2001 | Engel et al. | |
| 6,278,269 B1 | 8/2001 | Vig et al. | |
| 6,356,068 B1 | 3/2002 | Steiner et al. | |
| 6,545,332 B2 | 4/2003 | Huang | |
| 6,545,457 B2 | 4/2003 | Goto et al. | |
| 6,545,462 B2 | 4/2003 | Schott et al. | |
| 6,692,676 B1 | 2/2004 | Vig et al. | |
| 6,770,163 B1 | 8/2004 | Kuah et al. | |
| 6,781,359 B2 | 8/2004 | Stauth et al. | |
| 6,798,193 B2 | 9/2004 | Zimmerman et al. | |
| 7,193,412 B2 | 3/2007 | Freeman | |
| 7,265,531 B2 | 9/2007 | Stauth et al. | |
| 7,323,870 B2 | 1/2008 | Tatschl et al. | |
| 7,385,394 B2 | 6/2008 | Auburger et al. | |
| 7,476,953 B2 | 1/2009 | Taylor et al. | |
| 7,768,083 B2 | 8/2010 | Doogue et al. | |
| 7,816,772 B2 | 10/2010 | Engle et al. | |
| 7,838,973 B2 | 11/2010 | Dimasacat et al. | |
| 8,143,169 B2 | 3/2012 | Engel et al. | |
| 2004/0032251 A1 | 2/2004 | Zimmerman et al. | |
| 2004/0046248 A1* | 3/2004 | Waelti et al. | 257/712 |
| 2004/0080314 A1 | 4/2004 | Tsujii et al. | |
| 2004/0155644 A1 | 8/2004 | Stauth et al. | |
| 2004/0184196 A1 | 9/2004 | Jayasekara | |
| 2005/0167790 A1 | 8/2005 | Khor et al. | |
| 2005/0280411 A1 | 12/2005 | Bicking | |
| 2006/0033487 A1 | 2/2006 | Nagano et al. | |
| 2006/0068237 A1 | 3/2006 | Murphy et al. | |
| 2006/0175674 A1* | 8/2006 | Taylor et al. | 257/421 |
| 2006/0181263 A1 | 8/2006 | Doogue et al. | |
| 2006/0261801 A1* | 11/2006 | Busch | 324/207.21 |
| 2007/0170533 A1 | 7/2007 | Doogue et al. | |
| 2008/0013298 A1* | 1/2008 | Sharma et al. | 361/813 |
| 2008/0237818 A1* | 10/2008 | Engel et al. | 257/676 |
| 2009/0140725 A1* | 6/2009 | Ausserlechner | 324/207.2 |
| 2010/0188078 A1 | 7/2010 | Foletto et al. | |
| 2010/0201356 A1 | 8/2010 | Koller et al. | |
| 2010/0237450 A1 | 9/2010 | Doogue et al. | |
| 2010/0276769 A1 | 11/2010 | Theuss et al. | |
| 2010/0295140 A1 | 11/2010 | Theuss et al. | |
| 2011/0133732 A1 | 6/2011 | Sauber | |
| 2011/0304327 A1 | 12/2011 | Ausserlechner | |
| 2012/0013333 A1 | 1/2012 | Ararao et al. | |

FOREIGN PATENT DOCUMENTS

| | | |
|---|---|---|
| DE | 103 14 602 A1 | 10/2004 |
| DE | 10 2007 018 238 A1 | 10/2008 |
| EP | 0 361 456 A2 | 4/1990 |
| EP | 0 680 103 A1 | 11/1995 |
| EP | 0 898 180 | 2/1999 |
| EP | 0 898 180 A2 | 2/1999 |
| EP | 1 443 332 A1 | 8/2004 |
| FR | 2 748 105 | 10/1997 |
| JP | 363 084176 A | 4/1988 |
| JP | 04-152688 | 5/1992 |
| JP | 08-097486 | 4/1996 |
| JP | 9-166612 | 6/1997 |
| JP | 63-263782 | 10/1998 |
| JP | 11 074142 A | 3/1999 |
| JP | 11074142 | 3/1999 |
| JP | 2000-183241 A | 6/2000 |
| JP | 2001-141738 A | 5/2001 |
| JP | 2003-177171 | 6/2003 |
| JP | 2004-55932 | 2/2004 |
| JP | 2004-356338 | 12/2004 |
| WO | WO 03/107018 | 12/2003 |
| WO | WO 2004/027436 | 4/2004 |
| WO | WO 2006/060330 A1 | 6/2006 |
| WO | WO 2006/083479 | 8/2006 |
| WO | WO 2008/008140 A2 | 1/2008 |
| WO | WO 2008/008140 A3 | 1/2008 |
| WO | WO 2008/121443 A1 | 10/2008 |
| WO | WO 2010/065315 | 6/2010 |

OTHER PUBLICATIONS

Allegro MicroSystems, Inc., Hall-Effect IC Applications Guide, http://www.allegromicro.com/en/Products/Design/an/an27701.pdf, Copyright 1987, 1997, pp. 1-36.

Dwyer, "Back-Biased Packaging Advances (SE, SG & SH versus SA & SB)," http://www.allegromicro.com/en/Products/Design/packaging_advances/index.asp, Copyright 2008, pp. 1-5.

Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008, pp. 9-18.

Johnson et al., "Hybrid Hall Effect Device," Appl. Phys. Lett., vol. 71, No. 7, Aug. 1997, pp. 974-976.

Melexis Microelectronic Systems, Hall Applications Guide, Section 3—Applications, 1997 (48 pages).

PCT Search Report & Written Opinion for PCT/US2006/000363 dated May 11, 2006.

Foletto et al.; "Magnetic Sensor with Concentrator for Increased Sensing Range;" U.S. Appl. No. 12/360,889, filed Jan. 28, 2009; 27 pages.

U.S. Appl. No. 11/051,124, filed Feb. 4, 2005, 561 pages.

Lagorce et al.; "Magnetic and Mechanical Properties of Micromachined Strontium Ferrite/Polyimide Composites;" Journal of Microelectromechanical Systems; vol. 6, No. 4; Dec. 1997; pp. 307-312.

Lequesne et al.; "High-Accuracy Magnetic Position Encoder Concept;" IEEE Transactions on Industry Applications; vol. 35, No. 3; May/Jun. 1999; pp. 568-576.

Park et al.; "Ferrite-Based Integrated Planar Inductors and Transformers Fabricated at Low Temperature;" IEEE Transactions on Magnetics; vol. 33, No. 5; Sep. 1997; pp. 3322-3324.

PCT Search Report and Written Opinion for PCT/US2009/065044 dated Jan. 7, 2010.

U.S. Pat. No. 7,476,053; Part 1 of 2; 251 pages.

U.S. Pat. No. 7,476,053; Part 2 of 2; 320 pages.

PCT International Preliminary Report on Patentability and Written Opinion of the ISA; dated Jun. 7, 2011; for PCT Pat. App. No. PCT/US2009/065044; 7 pages.

Office Action dated Jul. 21, 2011 from U.S. Appl. No. 12/360,889, filed Jan. 28, 2009, 18 pages.

Response to Office Action dated Jul. 21, 2011 with EFS Acknowledgement from U.S. Appl. No. 12/360,889, filed Jan. 28, 2009, 12 pages.

Office Action dated Jan. 17, 2012; for U.S. Appl. No. 12/360,889; 13 pages.

Notice of Allowance dated Feb. 3, 2012; for U.S. Appl. No. 12/878,134; 7 pages.

Office Action dated Feb. 22, 2012; for U.S. Appl. No. 13/241,380; 23 pages.
CN Office Action (w/English translation); dated Sep. 10, 2010; for CN Pat. App. No. CN 2008 800088956; 14 pages.
PCT Search Report and Written Opinion of the ISA for PCT/US2008/053551; dated Jul. 15, 2008; 11 pages.
PCT International Preliminary Report on Patentability for PCT/US2008/053551; dated Oct. 8, 2009; 7 pages.
Alllegro "True Zero-Speed Low-Jitter High Accuracy Gear Tooth Sensor;" ATS625LSG; 2005; Allegro MicroSystems, Inc. Worcester, MA 01615; pp. 1-21.
Allegro "Two-Wire True Zero Speed Miniature Differential Peak-Detecting Gear Tooth Sensor;" ATS645LSH; 2004; Allegro MicroSystems, Inc., Worcester, MA 01615; pp. 1-14.
U.S. Patent No. 7,816,772 issued on Oct. 2, 2008 downloaded on Apr. 13, 2011; 277 pages.
U.S. Appl. No. 12/878,134, filed Sep. 9, 2010 downloaded on Apr. 13, 2011; Part 1 of 5; 300 pages.
U.S. Appl. No. 12/878,134, filed Sep. 9, 2010 downloaded on Apr. 13, 2011; Part 2 of 5; 300 pages.
U.S. Appl. No. 12/878,134, filed Sep. 9, 2010 downloaded on Apr. 13, 2011; Part 3 of 5; 300 pages.
U.S. Appl. No. 12/878,134, filed Sep. 9, 2010 downloaded on Apr. 13, 2011; Part 4 of 5; 300 pages.
U.S. Appl. No. 12/878,134, filed Sep. 9, 2010 downloaded on Apr. 13, 2011; Part 5 of 5; 434 pages.
Response Office Action filed Sep. 27, 2012; for U.S. Appl. No. 12/360,889; 12 pages.
Response to: Officte Action filed Oct. 9, 2012; for U.S. Appl. No. 13/241,380; 6 pages.
Response to Final Office Action dated Jan. 17, 2012 for U.S. Appl. No. 12/360,889 and RCE filed May 17, 2012, 15 pages.
Response filed on May 3, 2012; to Office Action dated Feb. 22, 2012; for U.S. Appl. No. 13/241,380, filed Sep. 23, 2011; 16 pages.

Office Action dated Jun. 7, 2012, U.S. Appl. No. 12/360,889, filed Jan. 28, 2009, 9 pages.
Final Office Action dated Jul. 19, 2012; for U.S. Appl. No. 13/241,380; 18 pages.
Letter to NTD Patent and Trademark Agency; dated Feb. 14, 2011; for CN Pat. App. No. 200880008895.6; with instructions regarding Response to Chinese Office Action dated Sep. 20, 2010; 8 pages.
Letter from NTD Patent and Trademark Agency; dated Mar. 28, 2011; for CN Pat. App. No. 200880008895.6; enclosing Response to Office Action in Chinese language; 7 pages.
Letter from NTD Patent and Trademark Agency; dated Jul. 20, 2011; for CN Pat. App. No. 200880008895.6; enclosing Notice of Allowance in the Chinese language; 5 pages.
Letter from Yuasa and Hara; dated Jul. 26, 2012; for JP Pat. App. No. 2010-501028; enclosing First Official Action received Jul. 25, 2012; 10 pages.
Letter to Yuasa and Hara; dated Aug. 13, 2012; for JP Pat. App. No. 2010-501028; 1 page.
Letter from Yuasa and Hare; dated Oct. 16, 2012; for JP Pat. App. No, 2010-501028; enclosing response to First Official Action; filed on Sep. 143, 2012; in the Japanese language; 8 pages.
Office Action dated Jan. 18, 2013 for U.S. Appl. No. 12/360,889; 7 pages.
Notice of Allowance; dated Feb. 21, 2013; for U.S. Appl. No. 13/241,380; 9 pages.
Notification of Transmittal of the International Search Report and the Written Opinion of the International Searching Authority, or the Declaration, PCT/US2012/068912, date of mailing Apr. 24, 2013, 6 pages.
Written Opinion of the International Searching Authority, PCT/US2012/068912, date of mailing Apr. 24, 2013, 9 pages.

* cited by examiner

MAGNETIC FIELD SENSORS AND METHODS FOR FABRICATING THE MAGNETIC FIELD SENSORS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors, and, more particularly, to magnetic field sensors having a magnetic field sensing element die and magnet and also to the assembly and packaging of the magnetic field sensors.

BACKGROUND OF THE INVENTION

Magnetic field sensors in the form of so-called "proximity detectors" that can detect the presence of a ferromagnetic object proximate to the magnetic field sensor are known. Proximity detectors typically include a permanent magnet to generate a magnetic field and also include a magnetic field sensing element, for example, a Hall effect element, to detect changes in the strength of the magnetic field associated with the permanent magnet as a ferromagnetic object moves through the magnetic field.

The output signal of a magnetic field sensing element is dependent upon the strength of a magnetic field that the magnetic field sensing element experiences. Therefore, the magnetic field sensing element can detect a distance between the proximity detector and a ferromagnetic object within the magnetic field generated by a permanent magnet. The range over which the ferromagnetic object can be detected is limited by the flux density, i.e., the strength of the magnetic field.

Where it is desired to determine the speed or rotational position of a rotating object, such as a disk mounted on a shaft, the object can be provided with ferromagnetic surface features, such as teeth, that project toward the proximity detector. The proximity of a tooth to the proximity detector tends to increase the strength of the magnetic field proximate to a proximity detector. Accordingly, by monitoring the output of the proximity detector, the rotational speed of the disk can be determined by con elating the peaks in the output of the proximity detector with the known number of teeth on the circumference of the disk. Similarly, when the teeth are irregularly spaced in a predetermined pattern, the rotational position of the object can be determined by correlating the peak intervals with the known intervals between the teeth on the disk.

One type of proximity detector uses a Hall effect element. The Hall effect element is typically mounted so that is has a maximum response axis directed toward the object to be sensed. The associated magnet is mounted in a position to achieve a magnetic field aligned generally along the maximum response axis of the Hall effect element. The object to be sensed can be a high magnetic permeability component that can have projecting surface features, which increase the strength of the magnet's magnetic field as the distance between the surface of the object and the permanent magnet is reduced. While one form of object can be a gear, another form of object can be a segmented ring magnet. Yet another form of object does not rotate at all, but merely moves closer to or further away from the proximity detector. The object to be sensed moves relative to the stationary Hall effect element within the proximity detector, and in doing so, causes the magnetic flux through the Hall effect element to vary in a manner corresponding to the position of the object. With the change in magnet flux, there occurs the corresponding change in magnet field strength, which increases (or alternatively, decreases) the output signal from the Hall effect element.

It will be understood that, within an integrated proximity detector, a position or spacing of the magnet relative to the magnetic field sensing element, e.g., the Hall effect element, greatly influences the sensitivity of the proximity detector. Therefore, it is desirable that the spacing be close and that spacing be consistent device to device.

With the increasing sophistication of products, proximity detectors have become common in automobile control systems. Examples of automotive proximity detectors include proximity detectors that detect ignition timing from a position of an engine crankshaft and/or camshaft, and the proximity detectors that detect a position or rotation and a speed of rotation of an automobile wheel for anti-lock braking systems and four wheel steering systems.

A common shortcoming of proximity detectors is their dependence upon the distance, known as the air gap, between the object to be sensed and the magnetic field sensing element within the proximity detector. More specifically, as the air gap increases, the output of a Hall effect element within the proximity detector, which is directly proportional to the strength of the magnetic field, decreases, making it more difficult to accurately analyze the output of the Hall effect element.

Conventionally, the air gap is defined as a distance between the object to be sensed and the outer surface of the package containing the proximity detector. However, as used herein, the term "effective air gap" is used to describe a distance between the object to be sensed and the magnetic field sensing element, e.g., Hall effect element, within the packaged proximity detector.

Some forms of proximity detectors that package a magnet and a Hall effect element together are described in U.S. Pat. No. 5,963,028, issued Oct. 5, 1999, and U.S. Pat. No. 6,265, 865, issued Jul. 24, 2001, which are incorporated herein by reference in their entirety.

It is known that a magnet is relatively expensive. The manufacture of conventional forms of proximity detectors does not allow the magnet to be reused or replaced once the molding step is completed. Thus, if a conventional proximity detector fails manufacturing testing after molding, the cost of the magnet is lost in addition to the cost of the semiconductor die and packaging materials.

It would be desirable to provide a packaging scheme for a proximity detector (or magnetic field sensor) that would provide reliable protection from the environments that would avoid an excessive increase in the effective air gap between the associated magnetic field sensing element and the object to be sensed, that would allow the magnetic field sensing element to be as close as possible to the magnet, and for which a proximity detector that fails testing during manufacture need not result in a loss of the magnet.

Other forms of proximity detectors include a magnet apart from an integrated proximity detector. Other fores of magnetic field sensors employ no magnet at all, but instead sense an external magnetic field experienced by the magnetic field sensor. All of these forms of magnetic field sensors would also benefit from the above characteristics.

SUMMARY OF THE INVENTION

The present invention provides magnetic field sensors and methods to make the magnetic field sensors.

In accordance with one aspect of the present invention, a method of fabricating a magnetic field sensor includes attaching a magnetic field sensor circuit die to a first surface of a die attach pad of a lead frame. The die attach pad has the first surface and a second opposing surface. The method also includes forming a molded capsule enclosing the magnetic field sensor circuit die. The molded capsule includes a cavity having an inner cavity surface. A portion of the inner cavity surface is proximate to the second surface of the die attach pad. The cavity has a shape capable of retaining a liquid. The method also includes placing a magnet into the cavity and proximate to the second opposing surface of the die attach pad and placing a liquid encapsulant into the cavity proximate to the magnet. The method also includes curing the liquid encapsulate to a solid condition to retain the magnet.

In accordance with another aspect of the present invention, a magnetic field sensor includes a lead frame comprising a die attach pad. The die attach pad comprises first and second opposing surfaces. The magnetic field sensor also includes a magnetic field sensor circuit die proximate to the first surface of the die attach pad and a molded capsule enclosing the magnetic field sensor circuit die. The molded capsule includes a cavity having an inner cavity surface. A portion of the inner cavity surface is proximate to the second surface of the die attach pad. The cavity has a shape capable of retaining a liquid. The magnetic field sensor also includes a magnet proximate to the second surface of the die attach pad and disposed within the cavity. The magnetic field sensor also includes a cured liquid encapsulant disposed within the cavity and configured to retain the magnet within the cavity.

In accordance with another aspect of the present invention, a method of fabricating an integrated sensor includes attaching a magnetic field sensor circuit die to a first surface of a die attach pad of a lead frame. The die attach pad has the first surface and a second opposing surface. The method also includes forming a molded capsule enclosing the magnetic field sensor circuit die. The molded capsule covers the second surface of the die attach pad forming an insulating layer over the second surface of the die attach pad. The method also includes placing a magnet over the insulating layer and forming a molded enclosure surrounding the magnet.

In accordance with another aspect of the present invention, a magnetic field sensor includes a lead frame having a die attach pad. The die attach pad has first and second opposing surfaces. The magnetic field sensor also includes a magnetic field sensor circuit die coupled proximate to the first surface of the die attach pad and a molded capsule enclosing the magnetic field sensor circuit die. The molded capsule covers the second surface of the die attach pad forming an insulating layer over the second surface of the die attach pad. The magnetic field sensor also includes a magnet coupled proximate to the second surface of the die attach pad so that the insulating layer is between the magnet and the second surface of the die attach pad. The magnetic field sensor also includes a molded enclosure surrounding the magnet.

With the above arrangements, a packaging scheme for a magnetic field sensor provides reliable protection from the environment that avoids an excessive increase in an effective air gap between the associated magnetic field sensing element and the object to be sensed, that allows the magnetic field sensing element to be as close as possible to the magnet, and that does not result in loss of a costly magnet if the magnetic field sensor fails during manufacturing testing.

In accordance with another aspect of the present invention, a method of fabricating a magnetic field sensor includes attaching a magnetic field sensor circuit die to a first surface of a die attach pad of a lead frame, the die attach pad having the first surface and a second opposing surface. The method also includes forming a molded capsule enclosing the magnetic field sensor circuit die. The molded capsule includes a cavity having an inner cavity surface. A portion of the inner cavity surface is proximate to the second surface of the die attach pad. The cavity has a shape capable of retaining a liquid. The method also includes placing a liquid material into the cavity and proximate to the second opposing surface of the die attach pad. The liquid material is filled with ferromagnetic particles to either generate a magnetic field or to concentrate a magnetic field. The method also includes curing the liquid material.

In accordance with another aspect of the present invention, a magnetic field sensor includes a lead frame comprising a die attach pad. The die attach pad has first and second opposing surfaces. The magnetic field sensor also includes a magnetic field sensor circuit die proximate to the first surface of the die attach pad and a molded capsule enclosing the magnetic field sensor circuit die. The molded capsule includes a cavity having an inner cavity surface. A portion of the inner cavity surface is proximate to the second surface of the die attach pad. The cavity has a shape capable of retaining a liquid. The magnetic field sensor also includes a cured liquid material disposed within the cavity. The cured liquid material is filled with ferromagnetic particles to either generate a magnetic field or to concentrate a magnetic field.

In accordance with another aspect of the present invention, a method of fabricating a magnetic field sensor includes attaching a magnetic field sensor circuit die to a first surface of a die attach pad of a lead frame. The die attach pad has the first surface and a second opposing surface. The method also includes forming a molded capsule enclosing the magnetic field sensor circuit die. The molded capsule covers the second surface of the die attach pad forming an insulating layer over the second surface of the die attach pad. The method also includes forming a molded structure proximate to the second surface of the die attach pad. The molded structure is filled with ferromagnetic particles to either generate a magnetic field or to concentrate a magnetic field.

In the above arrangements, the ferromagnetic particles can be either hard ferromagnetic particles that can generate a permanent magnetic field, or they can be soft ferromagnetic particles that can concentrate a magnetic field.

In accordance with another aspect of the present invention, a magnetic field sensor includes a lead frame comprising a die attach pad. The die attach pad comprises first and second opposing surfaces. The magnetic field sensor also includes a magnetic field sensor circuit die coupled proximate to the first surface of the die attach pad. The magnetic field sensor also includes a molded capsule enclosing the magnetic field sensor circuit die. The molded capsule covers the second surface of the die attach pad forming an insulating layer over the second surface of the die attach pad. The magnetic field sensor also includes a molded structure proximate to the second surface of the die attach pad. The molded structure is filled with ferromagnetic particles to either generate a magnetic field or to concentrate a magnetic field.

With the above arrangements, a packaging scheme for a magnetic field sensor provides reliable protection from the environment that avoids an excessive increase in an effective air gap between the associated magnetic field sensing element and the object to be sensed, and that does not result in loss of a costly magnet if the magnetic field sensor fails during manufacturing testing.

In other words, the partially packaged magnetic field sensor can be tested in manufacturing in a form for which it is possible to remove the magnet. This may be accomplished, for example, by first testing the magnetic field sensor using a magnet in the testing apparatus that is magnetized and reused for various parts during testing. This allows the actual magnet in the final magnetic field sensor to only be placed into the magnetic field sensor after the testing and only into a known good die assembly.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "magnetic field sensor" is used to describe a circuit that includes a "magnetic field sensing element." Magnetic field sensors are used in a variety of applications, including, but not limited to, a current sensor that senses a magnetic field generated by a current flowing in a current conductor, a magnetic switch or "proximity detector" that senses the proximity of a ferromagnetic object, a proximity detector that senses passing ferromagnetic articles, for example, magnetic domains of a ring magnet or gear teeth, and a magnetic field sensor that senses a magnetic field density of a magnetic field.

While magnetic field sensing elements are shown and described below to be Hall effect elements, in other arrangements, the magnetic field sensing elements can be, but are not limited to, Hall effect elements, magnetoresistance elements, or magnetotransistors. As is known, there are different types of Hall effect elements, for example, a planar Hall element, and a vertical Hall element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ).

Figure 1:
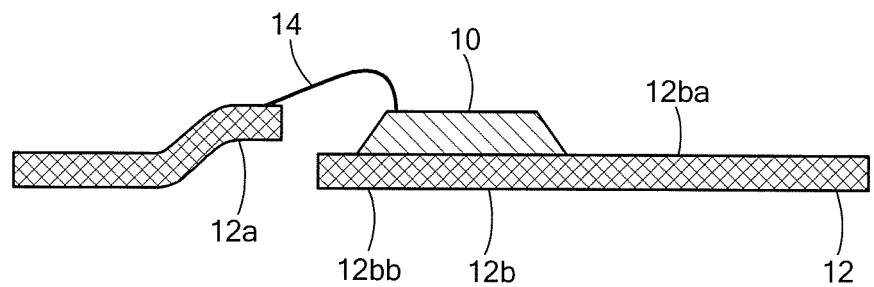
FIGS. 1-1C are cross sections that show a process flow for fabricating a magnetic field sensor in the form of a proximity detector.

Referring to FIG. 1, a method of fabricating a magnetic field sensor includes attaching a magnetic field sensor circuit die 10, i.e. a magnetic field sensing element, e.g., a Hall effect element, to a first surface 12ba of a die attach pad 12b of a lead frame 12. The die attach pad 12b has the first surface 12ba and a second opposing surface 12bb. The method can also include coupling the magnetic field sensor circuit die 10 to leads 12a of the lead frame 12 with wire bonds 14 or the like, Referring now to FIG. 1A, in which like elements of FIG. 1 are shown having like reference designations, the method further includes forming a molded capsule 16 enclosing the magnetic field sensor circuit die 10. The molded capsule 16 can be made of a variety of materials, for example, E670C mold compound from the Sumitomo Corporation, HYSOL® MG52F mold compound from the Henkel Loctite Corporation, or PLASKON® CK-6100 mold compound from Cookson Electronics. In some embodiments, the molded capsule 16 can be formed in a one step molding process. In some embodiments, the molded capsule 16 can be comprised of a single uniform material. The molded capsule 16 can include a cavity 16c having an inner cavity surface 16ca. A portion of the inner cavity surface 16ca can be proximate to or can include the second surface 12bb of the die attach pad 12b. The cavity 16c has a shape capable of retaining a liquid. In other words, the cavity can be surrounded by a rim 16a, 16c and can be open in only one area, which will be more fully understood below from the discussion in conjunction with FIG. 1B.

Figure 1A:
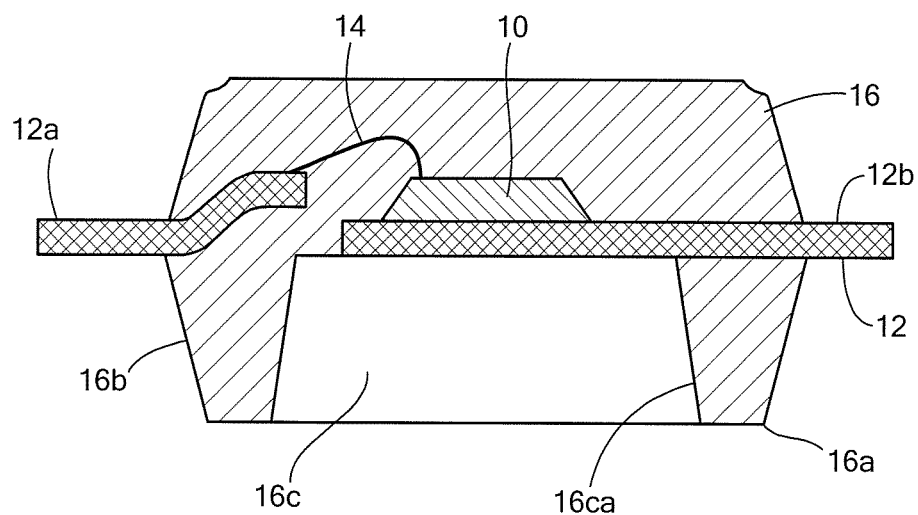
Figure 1B:
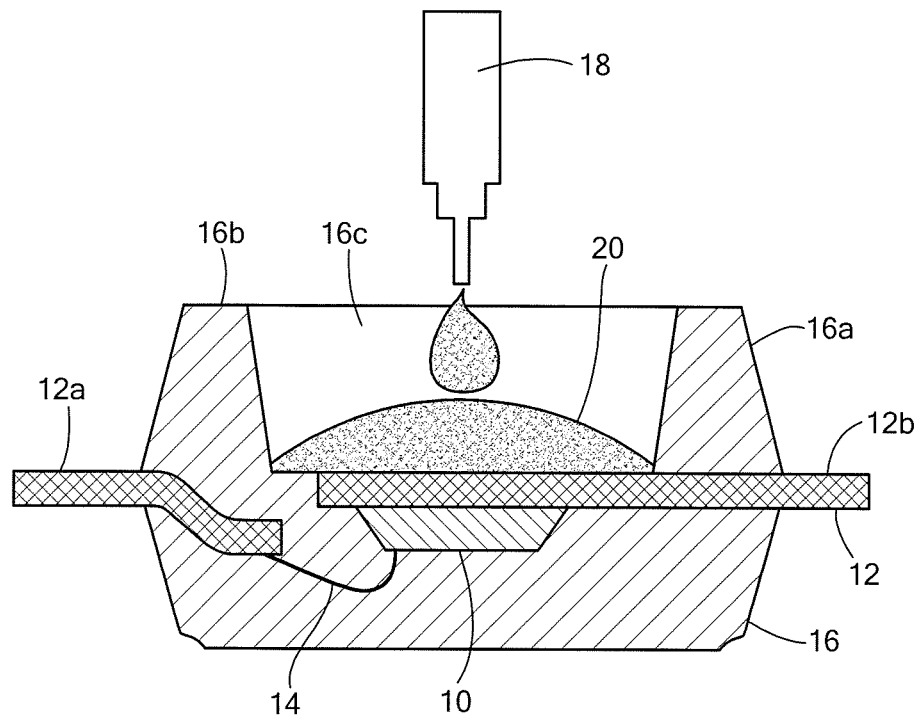

Referring now to FIG. 1B, in which like elements of FIGS. 1 and 1A are shown having like reference designations, a liquid encapsulant 20 can be deposited into the cavity 16c. The liquid encapsulant 20 can be made of a variety of materials, for example, HYSOL® FP4450 or FP4451 from the Henkel Loctite Corporation, CRP-3400 from the Sumitomo Corporation, or Circalok™ 6009 A/B from the Lord Corporation. The cavity 16c can be open to accept the liquid encapsulant 20, but otherwise enclosed by the rim 16a, 16b to keep the liquid encapsulant from leaving the cavity 16c.

Figure 1C:
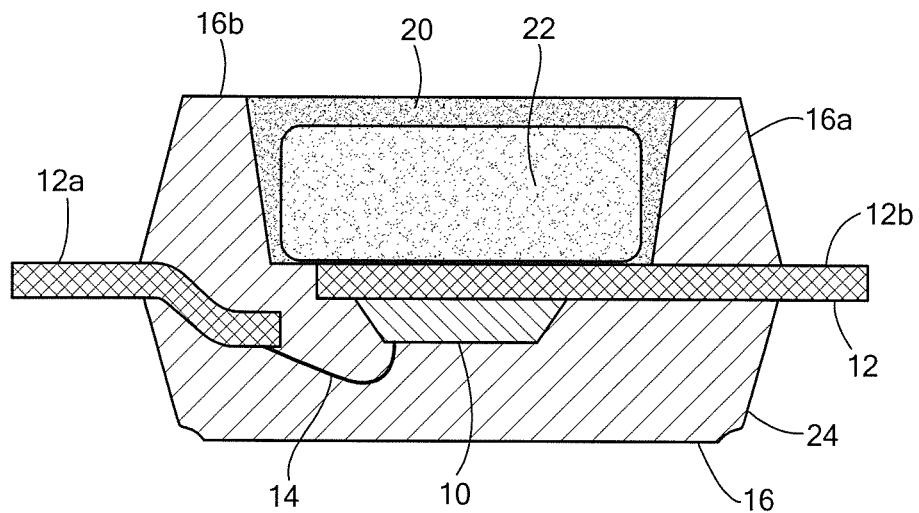

Referring now to FIG. 1C, in which like elements of FIGS. 1-1B are shown having like reference designations, a permanent magnet 22 can be placed into the cavity 16c proximate to the second surface 12bb of the die attach pad 12b, and can be essentially surrounded by the liquid encapsulant 20, since the liquid encapsulant deposited in FIG. 1B will tend to rise around the magnet 22 as it is immersed in the liquid encapsulant 20. Thereafter, the liquid encapsulant can be cured either at room temperature or at elevated temperature.

In some other arrangements, the magnet 22 is placed into the cavity 16c before the liquid encapsulant 20, and thereafter the liquid encapsulant 20 is deposited into the cavity 16c to surround the magnet 22. In some embodiments, an insulating epoxy, for example a die attach epoxy, can be used to attach the magnet to the lead frame prior to application of the liquid encapsulant 20.

In some embodiments, an insulative material 30 can be disposed between the magnet 22 and the lead frame 12, for example a glass filled material, e.g., Dow Coring 7030 Die Attach Adhesive. Application of this material between the magnet 22 and the lead frame 12 can result in an accurate and repeatable separation between the magnet 22 and the lead frame 12, which would tend to result in magnetic field sensors with improved unit-to-unit sensitivity consistency.

In some embodiments, the magnet 22 has a magnetic field oriented approximately perpendicular to the first and second surfaces 12ba, 12bb, respectively, of the die attach pad 12b. In these embodiments, the magnetic field sensor circuit die 10 comprises a magnetic field sensing element, for example, a Hall effect element, having a maximum response axis also approximately perpendicular to the first and second surfaces 12ba, 12bb of the die attach pad 12b.

In some other embodiments, the magnet 22 has a magnetic field oriented approximately parallel to the first and second surfaces 12ba, 12bb, respectively, of the die attach pad 12b. In these embodiments, the magnetic field sensor circuit die 10 comprises a magnetic field sensing element, for example, a giant or anisotropic magnetoresistance element, having a maximum response axis also approximately parallel to the first and second surfaces 12ba, 12bb of the die attach pad 12b.

The above-described method results in a magnetic field sensor 24 having the lead frame 12 with the die attach pad 12b, the die attach pad 12b having the first and second opposing surfaces 12ba, 12bb, respectively. The magnetic field sensor circuit die 10 is proximate to the first surface 12ba of the die attach pad 12b. The molded capsule 16 encloses the magnetic field sensor circuit die 10. The magnet 22 is proximate to the second surface 12bb of the die attach pad 12b and disposed within the cavity 16c. The cured liquid encapsulant 20 is disposed within the cavity 16c and configured to retain the magnet 22 within the cavity 16c.

In some alternate embodiments, the magnet 22 is omitted. In these embodiments, the liquid encapsulant 20 can fill the entire cavity 16c and can be filled with magnetic particles to generate a permanent magnetic field in place of the magnet 22. For, example the liquid encapsulant 20 can be an epoxy material filled with strontium ferrite particles. These embodiments can also form a proximity detector.

In still some other alternate embodiments, the magnet 22 is also omitted and the liquid encapsulant 20 is filled with soft magnetic particles to form a magnetic field concentrator, or flux concentrator. For, example the liquid encapsulant 20 can be an epoxy material filled with NiZn or MnZn ferrite particles. These embodiments also form a proximity detector if the object to be sensed generates a magnetic field. However these embodiments can also form a magnetic field sensor used for other applications.

Figure 2:
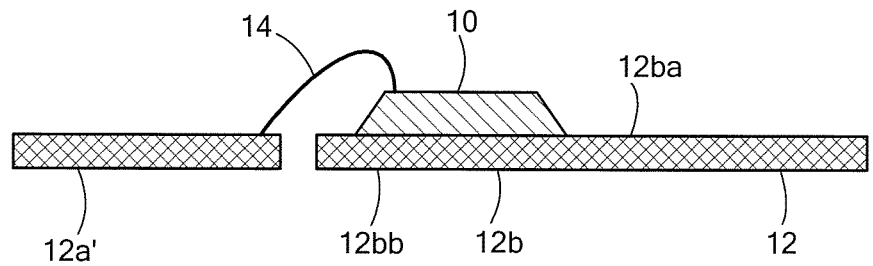
FIGS. 2-2C are cross sections that show another process flow for fabricating another magnetic field sensor in the form of a proximity detector.
Figure 2A:
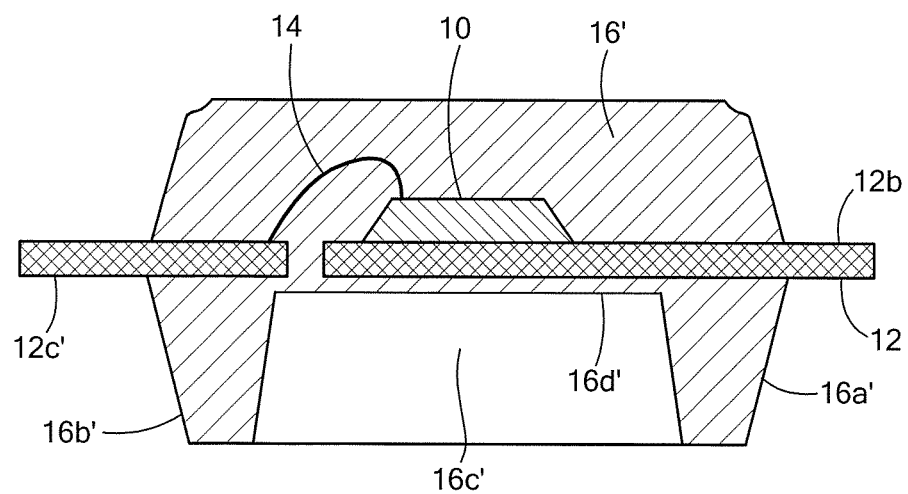
Figure 2B:
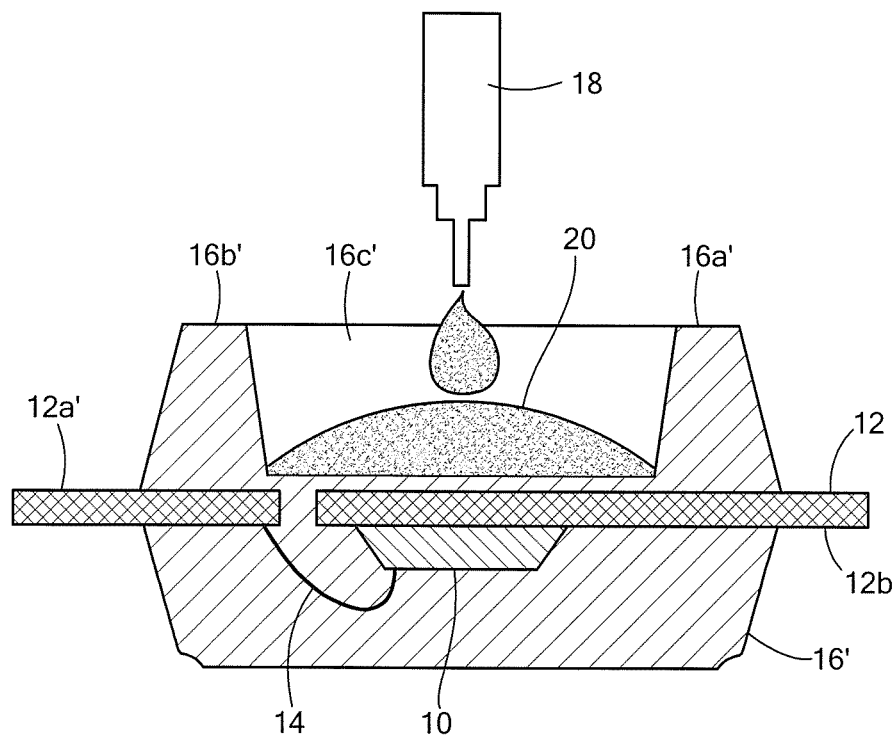
Figure 2C:
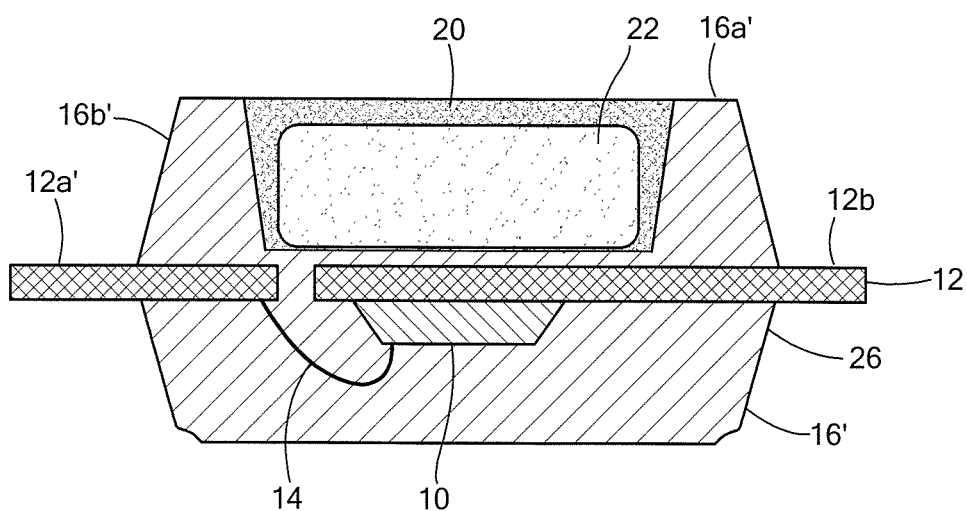

Referring now to FIGS. 2-2C, in which like elements of FIGS. 1-1C are shown having like reference designations, but wherein a molded capsule 16 is different than the molded capsule 16 of FIGS. 1-1C a magnetic field sensor 26 (FIG. 2C) is fabricated in a way similar to the magnetic field sensor 24 of FIG. 1C. The different molded capsule 16' has a region, which, unlike the molded capsule 16 of FIGS. 1-1C forms an insulating layer 16d' proximate to the second opposing surface 12bb of the die attach pad 12b between the magnet 22 and the second opposing surface 12bb of the die attach pad 12b. The insulating layer 16d' can have a predetermined thickness to separate the magnet 22 from the second surface 12bb of the die attach pad 12b by a predetermined distance.

The lead frame 12 includes leads 12a', which unlike the leads 12a of FIG. 1 can have no bend, since the magnet 22 will not contact the leads 12a, otherwise shorting them to the die attach pad 12b.

As described above in conjunction with FIG. 1C, in some embodiments the magnet 22 can be omitted and the liquid encapsulant 20 can be filled with magnetic particles to form a permanent magnet or with soft magnetic particles to form a flux concentrator.

Figure 3:
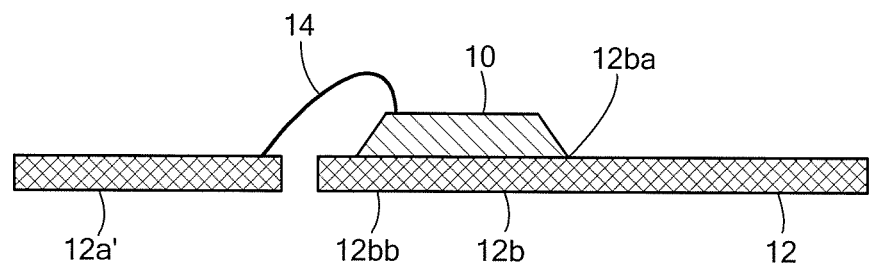
FIGS. 3-3C are cross sections that show yet another process flow for fabricating yet another magnetic field sensor in the form of a proximity detector.

Referring now to FIG. 3, in which like elements of FIG. 1 are shown having like reference designations, another method of fabricating a magnetic field sensor includes attaching the magnetic field sensor circuit die 10, i.e., a magnetic field sensing element, to the first surface 12ba of the die attach pad 12b of the lead frame 12. The die attach pad 12b has the first surface 12ba and the second opposing surface 12bb. The method can also include coupling the magnetic field sensor circuit die 10 to the leads 12a of the lead frame 12 with the wire bonds 14 or the like.

Figure 3A:
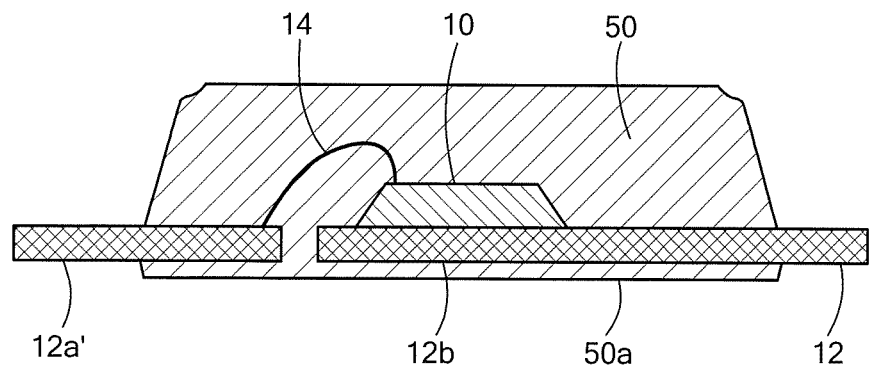

Referring now to FIG. 3A, in which like elements of FIG. 3 are shown having like reference designations, the method further includes forming a molded capsule 50 enclosing the magnetic field sensor circuit die 10. The molded capsule 50 can be made of a variety of materials, for example, E670C mold compound from the Sumitomo Corporation. HYSOL® MG52F mold compound from the Henkel Loctite Corporation, or PLASKON® CK-6100 mold compound from Cookson Electronics. In some embodiments, the molded capsule 50 can be formed in a one step molding process. The molded capsule 50 covers the second surface 12bb of the die attach pad 12b forming an insulating layer 50a over the second surface 12bb of the die attach pad 12b.

Figure 3B:
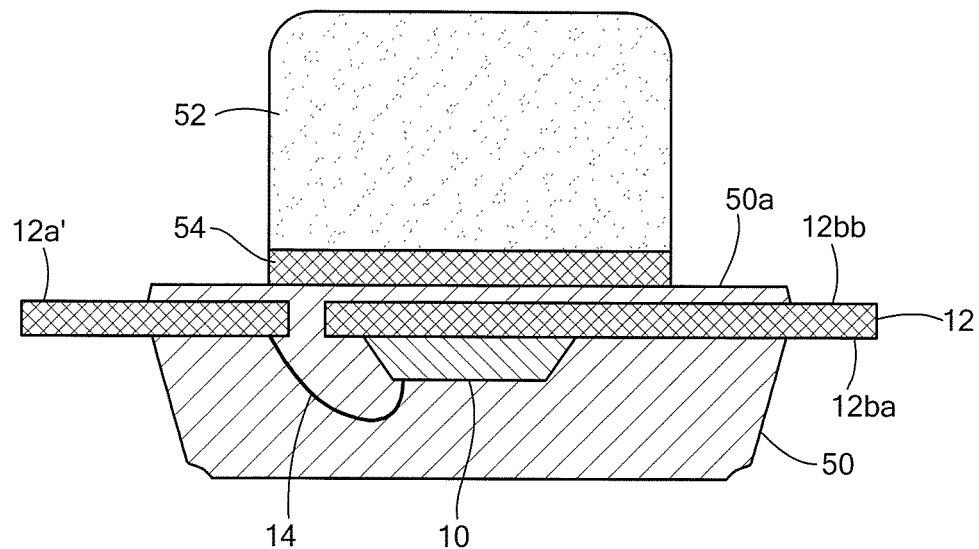

Referring now to FIG. 3B, in which like elements of FIGS. 3 and 3A are shown having like reference designations, a magnet 52 can be placed over the insulating layer 50a. In some embodiments, an adhesive layer 54 is disposed between the magnet 52 and the insulating layer 50a. The adhesive layer can be cured after the magnet 52 is disposed thereon. The insulating layer 50a can have a predetermined thickness to separate the magnet 52 from the second surface 12bb of the die attach pad 12b by a predetermined distance.

Figure 3C:
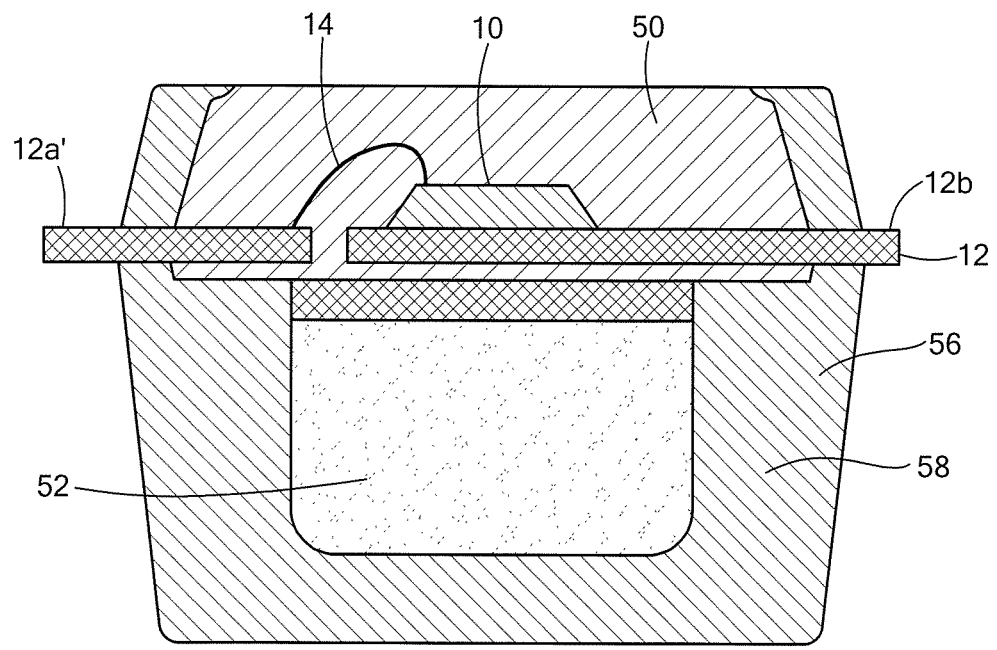

Referring now to FIG. 3C, in which like elements of FIGS. 3-3B are shown having like reference designations, a molded enclosure 56 is formed surrounding at least the magnet 52. In some embodiments, the molded enclosure 56 can also surround or partially surround the molded capsule 50.

In some embodiments, the magnet 52 has a magnetic field oriented approximately perpendicular to the first and second surfaces 12ba, 12bb, respectively of the die attach pad 12b.

In these embodiments, the magnetic field sensor circuit die 10 comprises a magnetic field sensing element, for example, a Hall effect element, having a maximum response axis also approximately perpendicular to the first and second surfaces 12ba, 12bb of the die attach pad 12b.

In some other embodiments, the magnet 52 has a magnetic field oriented approximately parallel to the first and second surfaces 12ba, 12bb, respectively, of the die attach pad 12b. In these embodiments, the magnetic field sensor circuit die 10 comprises a magnetic field sensing element, for example, an anisotropic or giant magnetoresistance element, having a maximum response axis also approximately parallel to the first and second surfaces 12ba, 12bb of the die attach pad 12b.

The above-described method above results in a magnetic field sensor 58 having the lead frame 12 with the die attach pad 12b, the die attach pad 12b having the first and second opposing surfaces 12ba, 12bb, respectively. The magnetic field sensor circuit die 10 is proximate to the first surface 12ba of the die attach pad 12b. The molded capsule 50 encloses the magnetic field sensor circuit die 10 and forms an insulating layer 50a over the second surface 12bb of the die attach pad 12b. The magnet 52 is proximate to the second surface 12bb of the die attach pad 12b. The molded enclosure 56 surrounds at least the magnet 52.

In some other embodiments, similar to embodiments described above in conjunction with FIG. 1C, the magnet 52 can be omitted. In these embodiments, the material of the molded enclosure 56 can be filled either with magnetic particles to form a permanent magnet or with soft magnetic particles to form a flux concentrator. In these embodiments, it may be advantageous to form the molded enclosure 56 on only one side of the lead frame 12, i.e., a side of the lead frame 12 opposite to the molded capsule 50.

Figure 4:
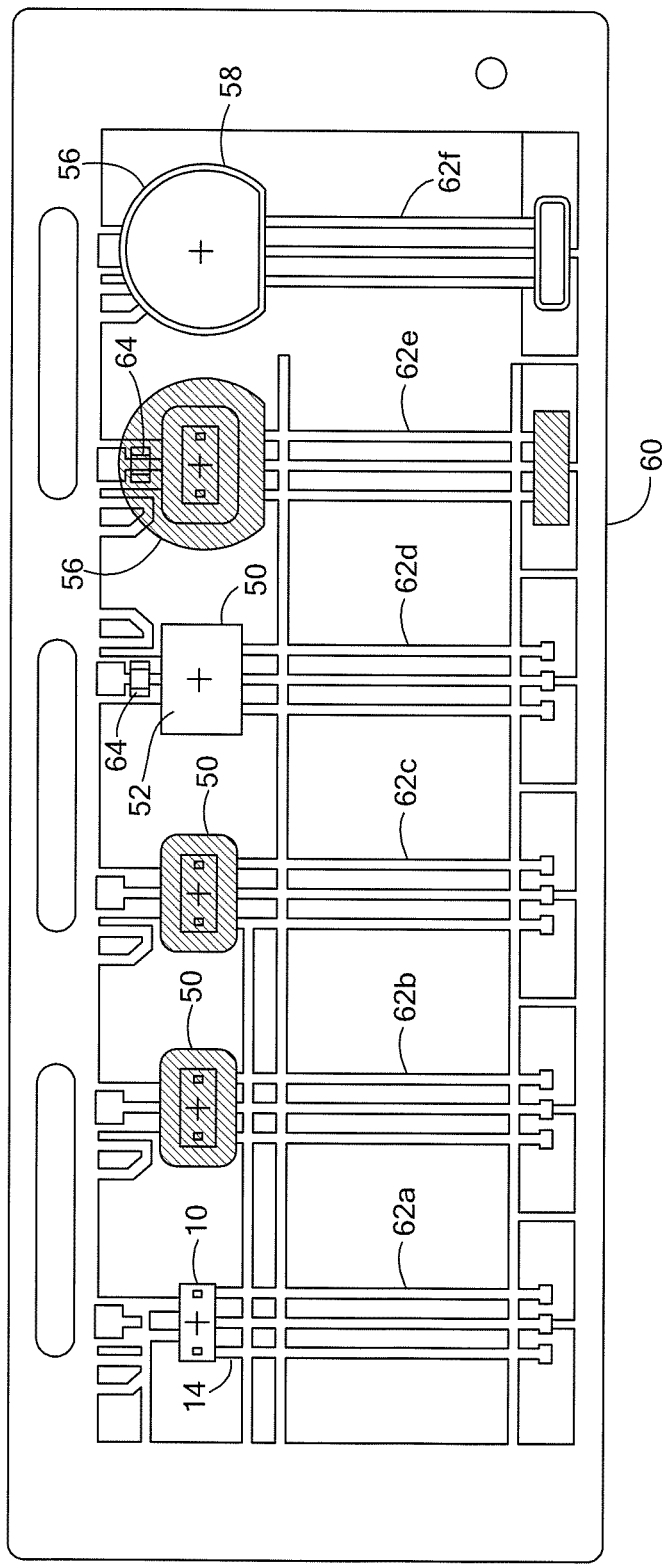
FIG. 4 is a top view showing fabrication steps for fabricating a magnetic field sensor, for example, the magnetic field sensor of FIGS. 3-3C, and including a capacitor encased during one of the molding steps.

Referring now to FIG. 4, in which like elements of FIGS. 3-3C are shown having like reference designations, a lead frame strip 60 includes a plurality of lead frames 62a-62f, each of which can be cut from the lead frame strip at a later time. Each one of the lead frames 62a-62f can be the same as or similar to the lead frame 12 shown in FIGS. 1-1C, 2-2C and 3-3C. Each one of the lead frames 62a-62f is shown at a different step in a manufacturing process.

The lead frames 62a-62f has the magnetic field sensor circuit die 10, i.e. the magnetic field sensing element, disposed over a first surface a die attach pad (not visible) of the lead frames 62a-62f. In these views, the magnetic field sensor circuit die 10 is over top of the die attach pad.

Regarding the lead frames 62b-62f, the molded capsule 50 encloses the magnetic field sensor circuit die 10 and forms an insulating layer (not visible) on the second surface (not visible) of the die attach pad (not visible). Regarding the lead frames 62c-62f, the magnet 52 is proximate to the second surface (not visible) of the die attach pad (not visible). For the lead frames 62c- and 62e-62f, the magnet 52 is under the die attach pad. The lead frame 62d is shown upside down from the others to more clearly show the magnet 52 as upward in this view. Regarding the lead frames 62d-62f, a capacitor 64 can be disposed on the same side of the lead frame 62d as the magnet 52, i.e., upward in the view of lead frame 62d. Regarding the lead frames 62e-62f, the molded enclosure 56 surrounds at least the magnet 52 to form the magnetic field sensor 58, but in some embodiments also surrounds the molded capsule 50 and/or the capacitor 64.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A method of fabricating a magnetic field sensor, comprising:
    attaching a magnetic field sensor circuit die to a first surface of a die attach pad of a lead frame, the die attach pad having the first surface and a second opposing surface;
    molding a molded capsule upon the die attach pad to enclose the magnetic field sensor circuit die, wherein the molded capsule includes a cavity having an inner cavity surface, wherein a portion of the inner cavity surface is proximate to the second surface of the die attach pad, and wherein the cavity has a shape capable of retaining a liquid;
    placing a magnet into the cavity and proximate to the second opposing surface of the die attach pad;
    placing a liquid encapsulant into the cavity proximate to the magnet; and
    curing the liquid encapsulant to a solid condition to encapsulate the magnet.

2. The method of claim 1, wherein the molded capsule is comprised of a mold compound, wherein the molded capsule covers the second opposing surface of the die attach pad with the mold compound, wherein the mold compound of the molded capsule forms an insulating layer over the second opposing surface of the die attach pad between the magnet and the second opposing surface of the die attach pad.

3. The method of claim 1, wherein the molded capsule is formed in a one step molding process.

4. The method of claim 1, further comprising placing a glass filled epoxy onto the second surface of the die attach pad.

5. The method of claim 1, further comprising attaching a capacitor across at least two leads of the lead frame at a position that results in the capacitor being encased within the molded capsule.

6. The method of claim 1, wherein the magnet has a magnetic field oriented approximately perpendicular to the first and second surfaces of the die attach pad, and wherein the magnetic field sensor circuit die comprises a magnetic field sensing element having a maximum response axis approximately perpendicular to the first and second surfaces of the die attach pad.

7. The method of claim 1, wherein the magnet has a magnetic field oriented approximately parallel to the first and second surfaces of the die attach pad, and wherein the magnetic field sensor circuit die comprises a magnetic field sensing element having a maximum response axis approximately parallel to the first and second surfaces of the die attach pad.

8. A method of fabricating a magnetic field sensor, comprising:
    attaching a magnetic field sensor circuit die to a first surface of a die attach pad of a lead frame, the die attach pad having the first surface and a second opposing surface;
    forming a molded capsule enclosing the magnetic field sensor circuit die, wherein the molded capsule includes a cavity having an inner cavity surface, wherein a bottom of the inner cavity surface is proximate to the second surface of the die attach pad, and wherein the cavity has a continuous side wall extending from the bottom to form the cavity with a shape capable of retaining a liquid;
    placing a liquid material into the cavity and proximate to the second opposing surface of the die attach pad, wherein the liquid material is filled with ferromagnetic particles to either generate a magnetic field or to concentrate a magnetic field; and
    curing the liquid material.

9. The method of claim 8, wherein the cavity comprises a rim distal from the bottom of the cavity, the rim having an opening in a plane parallel to the die attach pad.

10. The method of claim 8, wherein the cavity has the shape capable of retaining a liquid when the liquid is not otherwise retained in relation to the cavity.

* * * * *

UNITED STATES PATENT AND TRADEMARK OFFICE
CERTIFICATE OF CORRECTION

PATENT NO. : 8,486,755 B2  
APPLICATION NO. : 12/328798  
DATED : July 16, 2013  
INVENTOR(S) : Virgil Ararao et al.

Page 1 of 1

It is certified that error appears in the above-identified patent and that said Letters Patent is hereby corrected as shown below:

In the Specification

Column 1, line 49 delete "con elating" and replace with --correlating--.

Column 7, line 12 delete "For, example" and replace with --For example,--.

Column 7, line 19 delete "For, example" and replace with --For example,--.

Column 7, line 27 delete "16" and replace with --16'--.

Signed and Sealed this  
Fourth Day of August, 2015

Michelle K. Lee  
*Director of the United States Patent and Trademark Office*